(12) United States Patent
Kim

(10) Patent No.: US 7,786,801 B2
(45) Date of Patent: Aug. 31, 2010

(54) OPERATIONAL AMPLIFIER HAVING HIGH SLEW RATE AND STABILITY, AND OPERATING METHOD THEREOF

(75) Inventor: Hyoung Rae Kim, Hwaseong-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 83 days.

(21) Appl. No.: 12/205,364

(22) Filed: Sep. 5, 2008

(65) Prior Publication Data

US 2009/0066415 A1 Mar. 12, 2009

(30) Foreign Application Priority Data

Sep. 11, 2007 (KR) ............... 10-2007-0092134

(51) Int. Cl.
*H03F 3/45* (2006.01)
(52) U.S. Cl. .................................... 330/255
(58) Field of Classification Search ............. 330/255
See application file for complete search history.

(56) References Cited

U.S. PATENT DOCUMENTS

| 5,745,010 | A |  | 4/1998 | Miyamoto et al. |
| 5,917,378 | A |  | 6/1999 | Juang |
| 6,351,186 | B1 |  | 2/2002 | Cusinato et al. |
| 6,788,143 | B1 | * | 9/2004 | Chen ............ 330/253 |
| 7,342,449 | B2 | * | 3/2008 | Ishii et al. ........ 330/253 |

FOREIGN PATENT DOCUMENTS

| JP | 07-030342 | 1/1995 |
| KR | 100377064 | 3/2003 |

* cited by examiner

*Primary Examiner*—Steven J Mottola
(74) *Attorney, Agent, or Firm*—F. Chau & Associates, LLC

(57) ABSTRACT

An operational amplifier includes a differential amplifier, an output stage, and a control unit. The differential amplifier generates a first current through a first output node and a second current through a second output node in response to a voltage difference between a first input signal input through a first input terminal and a second input signal input through a second input terminal. The output stage generates an output signal through an output node. The control unit receives a voltage of the first output node and a voltage of the second output node, as bias voltages, and controls an output current of the output stage to determine the output signal of the output stage in response to the received voltages of the first and second output nodes.

16 Claims, 7 Drawing Sheets

OPERATIONAL AMPLIFIER HAVING HIGH SLEW RATE AND STABILITY, AND OPERATING METHOD THEREOF

CROSS REFERENCE TO RELATED PATENT APPLICATION

This application claims priority under 35 U.S.C. §119 to Korean Patent Application No. 10-2007-0092134, filed on Sep. 11, 2007, in the Korean Intellectual Property Office, the disclosure of which is incorporated by reference herein.

BACKGROUND

1. Technical Field

Exemplary embodiments of the present invention relate to an operational amplifier, and more particularly, to an operational amplifier having a high slew rate and stability, and a method of operating the operational amplifier.

2. Discussion of Related Art

The load capacitance and power consumption of a liquid crystal panel driving apparatus for driving a liquid crystal panel of a liquid crystal display increases as the resolution of the display increases. For example, the driving apparatus may be a source driver such as a data line driver. The increase in load capacitance greatly affects the slew rate and stability of an operational amplifier included in the liquid crystal driving apparatus. An operational amplifier operating at low power and low voltage may be used in the driving apparatus to reduce power consumption.

The slew rate of an operational amplifier is the maximum rate of change of the output voltage of the operational amplifier, which may be measured in, for example, volts per microseconds. The slew rate may be obtained by dividing the bias current (or tail current) of an input stage by a compensation capacitance. The slew rate may be increased by increasing the bias current (or tail current) of the input stage or by decreasing the compensation capacitance.

However, increases to the bias current cause static current increases, which increase the power consumed by the operational amplifier. Increasing the compensation capacitance may improve the stability of the operational amplifier. However, increasing the compensation capacitance also increases the layout size of the operational amplifier, which may decrease slew rate. Further, decreasing the compensation capacitance can increase the settling time of the operational amplifier.

Thus, there is a need for an operational amplifier having a smaller compensation capacitance and a lower static current, which can provide a faster slew rate, better stability, and a reduced power consumption.

SUMMARY OF THE INVENTION

According to an exemplary embodiment of the present invention, an operational amplifier includes a differential amplifier, an output stage, and a control unit. The differential amplifier generates a first current through a first output node and a second current through a second output node in response to a voltage difference between a first input signal input through a first input terminal and a second input signal input through a second input terminal. The output stage generates an output signal through an output node. The control unit receives a voltage of the first output node and a voltage of the second output node, as bias voltages, and controls an output current of the output stage to determine the output signal of the output stage in response to the received voltages of the first and second output nodes.

The control unit may include a first self biased cascade current mirror, a second self biased cascade current mirror, a third self biased cascode current mirror, and a bias circuit. The first self biased cascode current mirror may be connected between the first output node, a first control node, and a first power source. The second self biased cascode current mirror may be connected between the second output node, the first power source, and an intermediate node. The third self biased cascode current mirror may be connected between the intermediate node, a second power source, and a second control node. The bias circuit may be connected between the first control node and the second control node and control each of a voltage of the first control node and a voltage of the second control node based on the voltage of the first output node and a voltage of the intermediate node.

The control unit may further include a first current control circuit and a second current control circuit. The first current control circuit may control a first variable current including at least part of a bias current of the differential amplifier based on the first input signal and current mirrored by the first self biased cascade current mirror. The second current control circuit may control a second variable current including at least part of a bias current of the differential amplifier based on the second input signal and current mirrored by the third self biased cascode current mirror.

The bias circuit may include a first transistor and a second transistor. The first transistor may be connected between the first control node and the second control node and turned on and off in response to the voltage of the first output node. The second transistor may be connected between the first control node and the second control node and turned on and off in response to the voltage of the intermediate node.

The output stage may include a PMOSFET and a NMOSFET. The PMOSFET is connected between the first power source and the output node. The PMOSFET may be turned on and off in response to the voltage of the first control node. The NMOSFET may be connected between the output node and the second power. The NMOSFET may be turned on and off in response to the voltage of the second control node.

The output stage may include a first compensation capacitor, a second compensation capacitor, a third compensation capacitor, and a fourth compensation capacitor. The first compensation capacitor may be connected between the first control node and the output node. The second compensation capacitor may be connected between the output node and the second control node. The third compensation capacitor may be connected between the output node and a mirror current branch of the first self biased cascode current mirror. The fourth compensation capacitor may be connected between the output node and a mirror current branch of the third self biased cascode current mirror.

The operational amplifier may further include a resistor connected between the output node and the second input node. The operational amplifier may be embodied as part of a common voltage generator of a display device.

The first self biased-cascode current mirror may include a first plurality of transistors serially connected between the first power source and the first output node and a second plurality of transistors serially connected between the first power source and the first control node. A drain and a gate of a first transistor of the first plurality of transistors may be connected to the first output node. A gate of a second transistor of the first plurality of transistors and a gate of a third transistor of the second plurality of transistors may be connected to a source of the first transistor.

The control unit may alternately include a first self biased cascode current mirror connected between the first output node, a first control node, a first power source, and a first intermediate node; a second self biased cascode current mirror connected between the second output node, the first self biased cascode current mirror, and a second intermediate node; a third self biased cascode current mirror connected between the second intermediate node, a second power source and a second control node; and a bias circuit connected between the first control node and the second control node and controlling each of a voltage of the first control node and a voltage of the second control node based on the voltage of the first output node and a voltage of the second intermediate node.

The alternate control unit may further include a first current control circuit connected between the second power source and the first intermediate node and a second current control circuit connected between the second power source and the second intermediate node. The first current control circuit may include a first plurality of transistors serially connected between the first intermediate node and the second power source and a second plurality of transistors serially connected between a third intermediate node and the second power source. The second current control circuit may include a first plurality of transistors serially connected between the second intermediate and the second power source and a second plurality of transistors serially connected between a fourth intermediate node and the second power source.

According to another exemplary embodiment of the present invention, a method of operating an operational amplifier includes generating a first current through a first output node and a second current through a second output node in response to a voltage difference between a first input signal input through a first input terminal and a second input signal input through a second input terminal, using a differential amplifier, receiving a voltage of the first output node and a voltage of the second output node, as bias voltages, and controlling a first control voltage and a second control voltage in response to the received voltages of the first and second output nodes, using a control unit, and controlling an output signal of an output node of an output stage in response to the first control voltage and the second control voltage.

The controlling of the first control voltage and the second control voltage includes mirroring the second current by using at least one self biased cascode current mirror, and controlling the first control voltage in response to the voltage of the first output node and the second control voltage in response to the second current that is mirrored, using the control unit.

According to an exemplary embodiment of the present invention, a display device includes a liquid crystal panel, a controller, a source driver, and a common voltage generator. The liquid crystal panel includes a plurality of data and gate lines. The controller generates a plurality of control signals to control an operation of the display device. The source driver is configured to output data signals to the data lines based on received image data and in response to at least one of the control signals. The gate driver is configured to drive the gate lines in response to at least one of the control signals. The common voltage generator is configured to generate a voltage for charging and discharging a common electrode line corresponding to the source lines. The common voltage generator includes a pair of operational amplifiers. Each operational amplifier includes the above described differential amplifier, output stage, and control unit. Each operational amplifier may be configured to output a first common voltage that swings between a first supply voltage and a second supply voltage in response to a first input signal input through a first input terminal and a second input signal complimentary to the first input signal and fedback through a second input terminal.

BRIEF DESCRIPTION OF THE DRAWINGS

The present invention will become more apparent by describing in detail exemplary embodiments thereof with reference to the attached drawings in which.

DETAILED DESCRIPTION OF EXEMPLARY EMBODIMENTS

Figure 1:
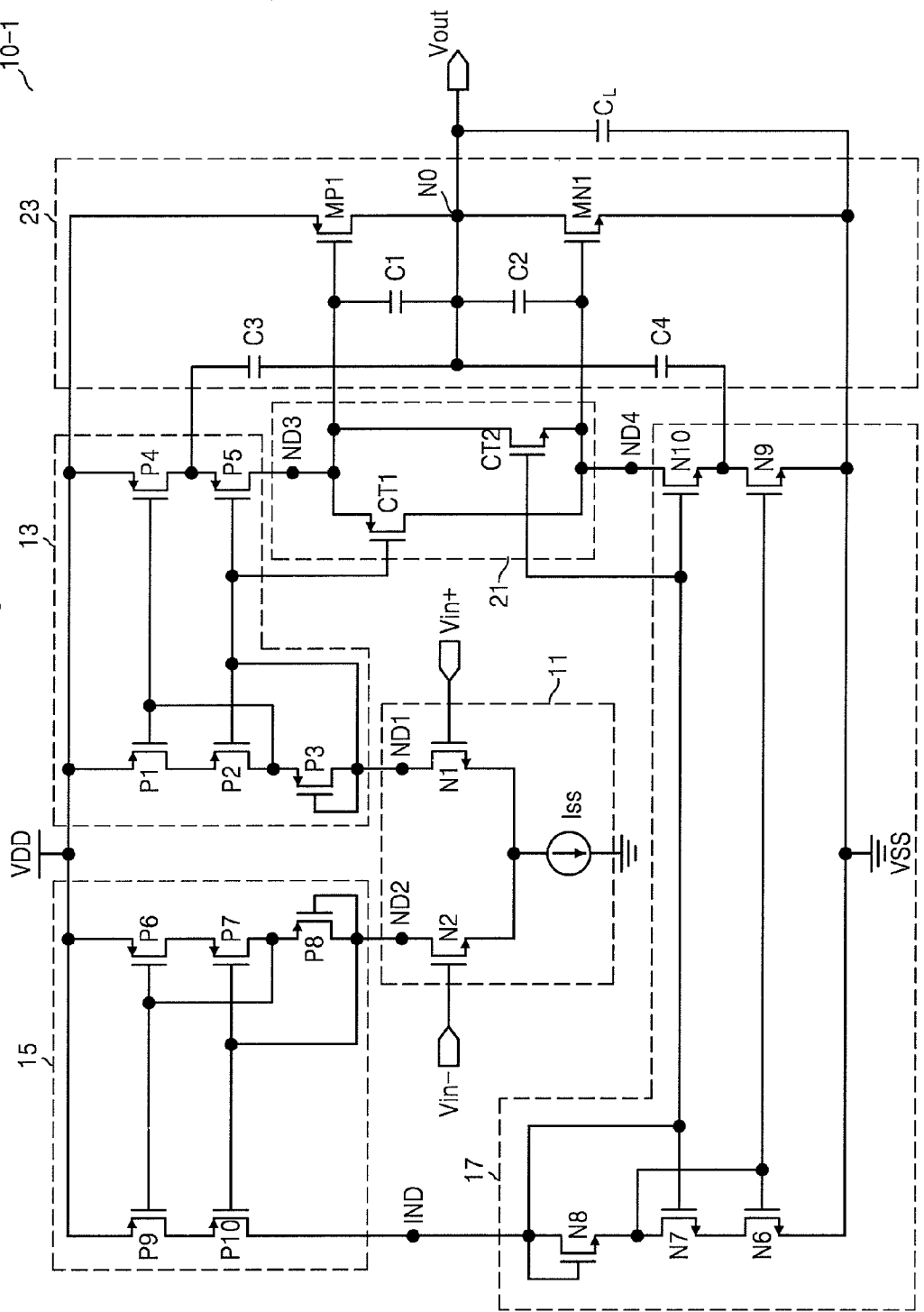
FIG. 1 is a circuit diagram of an operational amplifier according to an exemplary embodiment of the present invention.

Hereinafter, the present invention will be described in detail by explaining exemplary embodiments of the invention with reference to the attached drawings. Like reference numerals in the drawings denote like elements.

FIG. 1 is a circuit diagram of an operational amplifier 10-1 according to an exemplary embodiment of the present invention. Referring to FIG. 1, the operational amplifier 10-1 includes a differential amplifier 11, an output stage 23, and a control unit.

The differential amplifier 11 includes a first transistor N1 receiving a first input signal Vin+ input through a first input terminal, a second transistor N2 receiving a second input signal Vin− input through a second input terminal, and a current source Iss. The differential amplifier 11 includes a first output node ND1 and a second output node ND2 which are connected to a second power source VSS via the first and second transistors N1 and N2 and the current source Iss. The current source Iss controls the amount of bias current (or tail current) Ibias supplied to the differential amplifier 11.

The differential amplifier 11 generates a first current and a second current, respectively, via the first output node ND1 and the second output node ND2, in response to a voltage difference between the first input signal Vin+ and the second input signal Vin−. The first input signal Vin+ and the second input signal Vin− may be differential signals and the first current and the second current may be differential currents. Each of the first and second transistors N1 and N2 may be embodied by an n-channel metal oxide semiconductor field effect transistor (NMOSFET).

The control unit includes a first self biased-cascode current mirror 13, a second self biased-cascode current mirror 15, a third self biased-cascode current mirror 17, and a bias circuit 21. The control unit receives, as bias voltages, the voltage of the first output node ND1 and the voltage of an intermediate node IND generated based on the voltage of the second output node ND2. In response to the received voltages of the first output node ND1 and the intermediate node IND, the control unit adjusts the output current of the output stage 23 to determine an output signal Vout of the output stage 23.

The first self biased-cascode current mirror 13 includes a plurality of transistors P1-P3 serially connected between the first power source VDD and the first output node ND1 and a plurality of transistors P4 and P5 serially connected between the first power VDD and a first control node ND3. The transistors P1, P2, P4, and P5 are connected in the form of a cascode current mirror. The drain and gate of the transistor P3 for self bias are connected to the first output node ND1. The gate of each of the transistors PI and P4 is connected to the source of the transistor P3. The gate of each of the transistors P2 and P5 is connected to the first node ND1.

The first self biased-cascode current mirror 13 mirrors current in a reference current branch to a mirror current branch. For example, the current mirror 13 mirrors a first current flowing into a branch connected to the first output node ND1 to a mirror current branch connected to the first control node ND3. Each of the transistors P1, P2, P4, and P5 may be embodied by a p-channel metal oxide semiconductor field effect transistor (PMOSFET). The transistor P3 for self bias may be embodied by a diode connected PMOSFET.

The second self biased-cascode current mirror 15 includes a plurality of transistors P6, P7, and P8 serially connected between the first power source VDD and the second output node ND2 and a plurality of transistors P9 and P10 serially connected between the first power source VDD and the intermediate node IND. The transistors P6, P7, P9, and P10 form a cascode current mirror. The drain and gate of the transistor P8 for self bias are connected to the second output node ND2. The gates of each of the transistors P6 and P9 are connected to the source of the transistor P8. The gates of each of the transistors P7 and P10 are connected to the second node ND2.

The second self biased-cascode current mirror 15 mirrors a current in a reference current branch to a mirror current branch. For example, the current mirror 15 mirrors a second current flowing into a branch connected to the second output node ND2 to a mirror current branch connected to the intermediate node IND. Each of the transistors P6, P7, P9, and P10 may be embodied by a PMOSFET. The transistor P8 for self bias may be embodied by a diode connected PMOSFET.

The third self biased-cascode current mirror 17 includes a plurality of transistors N6, N7, and N8 serially connected between the intermediate node IND and the second power VSS and a plurality of transistors N9 and N10 serially connected between a second control node ND4 and the second power VSS. The transistors N6, N7, N9, and N10 are connected in the form of a cascode current mirror. The drain and gate of the transistor N8 for self bias are connected to the intermediate node IND. The voltage of the intermediate node IND may be generated based on at least a part of the second output current. The gates of each of the transistors N6 and N9 are connected to the source of the transistor N8. The gates of each of the transistors N7 and N10 are connected to the intermediate node IND.

For example, the third self biased-cascode current mirror 17 mirrors a current in a reference current branch to a mirror current branch. For example, the current mirror 17 mirrors a second current flowing into a branch connected to the intermediate node IND to a mirror current branch connected to the second control node ND4. Each of the transistors N6, N7, N9, and N10 may be embodied by an NMOSFET. The transistor N8 for self bias may be embodied by a diode connected NMOSFET.

The bias circuit 21 includes a first control transistor CT1 and a second control transistor CT2 connected in parallel between the first control node ND3 and the second control node ND4. The bias circuit 21 controls the voltage of the first control node ND3 (e.g., a first control voltage) and the voltage of the second control node ND4 (e.g., a second control voltage) based on the voltage of the first output node ND1 and the voltage of the intermediate node IND. The first control transistor CT1 is turned on/off in response to the voltage of the first output node ND1. The second control transistor CT2 is turned on/off in response to the voltage of the intermediate node IND.

For example, the bias circuit 21 can bias each of the transistors MP1 and MN1 forming the output stage 23 via each of the first control node ND3 and the second control node ND4. Accordingly, the bias circuit 21 can control the amount of the current flowing into the output stage 23, for example, the amount of static current. For example, the bias circuit 21 can control the output stage 23 so that the output stage 23 can perform a class AB amplification operation. The first control transistor CT1 may be embodied by a PMOSFET and the second control transistor CT2 may be embodied by an NMOSFET.

A bias circuit for biasing the output stage of a conventional operation amplifier needs additional current branches for biasing the output stage. However, since the bias circuit 21 according to the present embodiment is biased in response to at least part of each of the voltages of the output nodes of the differential amplifier 11, additional current branches for biasing are not needed so that the current consumed by the operational amplifier 10-1 can be reduced. Further, since the operational amplifier 10-1 according to the present embodiment does not need the additional current branches for the bias circuit 21, the layout size of the operational amplifier 10-1 is reduced.

The output stage 23 has a common source structure and includes a PMOSFET (MP1) connected between the first power source VDD and an output node NO and an NMOSFET (MN1) connected between the output node NO and the second power source VSS. The PMOSFET (MP1) is turned on/off in response to the voltage of the first control node ND3. The NMOSFET (MN1) is turned on/off in response to the voltage of the second control node ND4.

For example, when the first input signal Vin+ is greater than the voltage of the second input signal Vin−, the gate voltage of the PMOSFET (MP1) has a first level, for example, a low level, and the gate voltage of the NMOSFET (MN1) has a second level, for example, a high level. Alternately, when the first input signal Vin+ is smaller than the voltage of the second input signal Vin−, the gate voltage of the PMOSFET (MP1) has the second level, for example, a high level, and the gate voltage of the NMOSFET (MN1) has the first level, for example, a low level.

The output stage 23 includes a plurality of compensation capacitors C1, C2, C3, and C4. The first compensation capacitor C1 is connected between the first control node ND3 and the output node NO. The second compensation capacitor C2 is connected between the output node NO and the second control node ND4. The third compensation capacitor C3 is connected between the output node NO and the mirror current branch of the first self biased cascode current mirror 13. The fourth compensation capacitor C4 is connected between the output node NO and the mirror current branch of the third self biased cascode current mirror 17. For example, the output stage 23 may include nested cascode Miller compensation capacitors C1-C4 to improve the stability of the operational amplifier 10-1. Miller compensation capacitors may be used as the first and second compensation capacitors C1 and C2. Cascode Miller compensation capacitors may be used as the third and fourth compensation capacitors C3 and C4.

Figure 2:
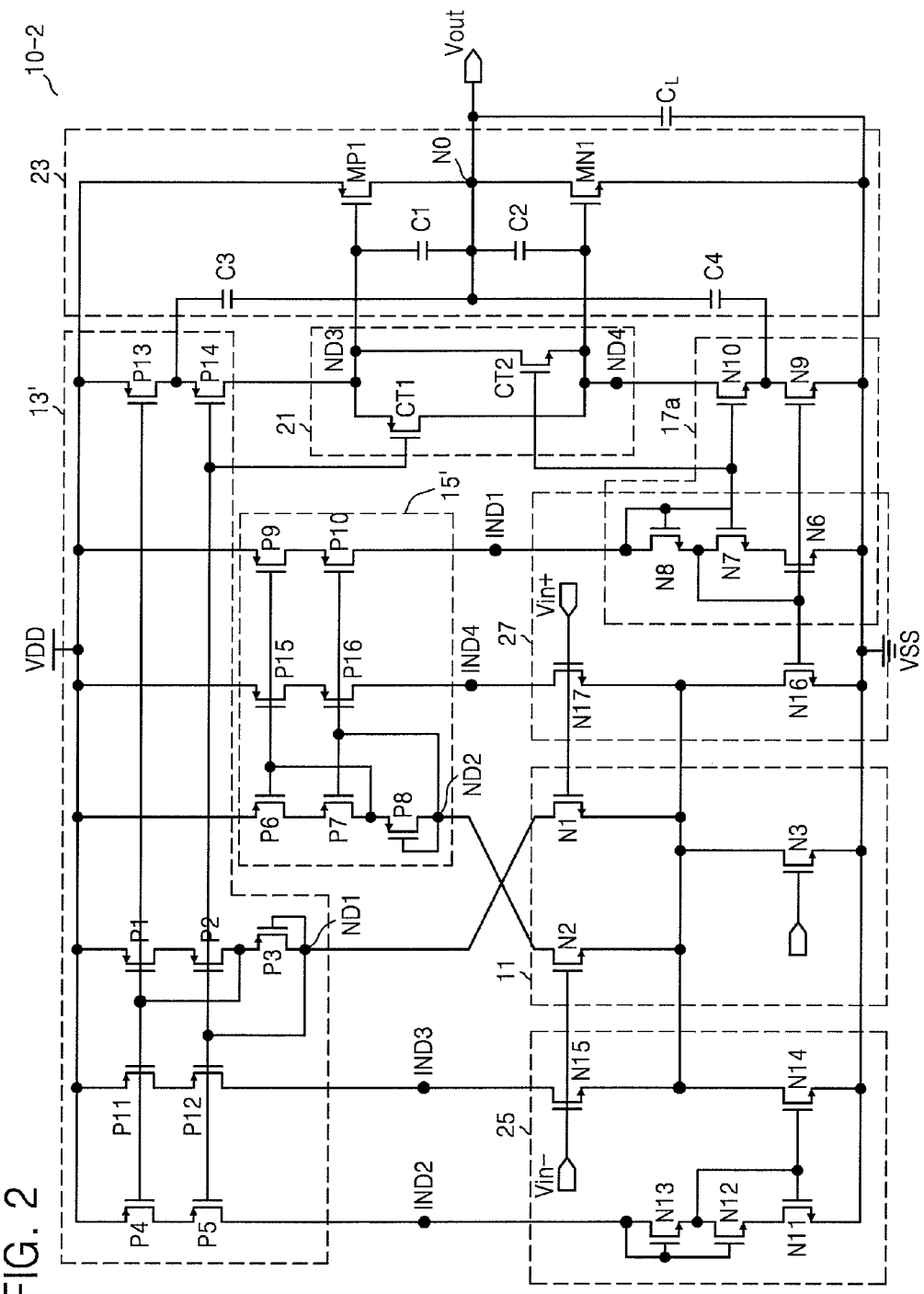
FIG. 2 is a circuit diagram of an operational amplifier according to another exemplary embodiment of the present invention.

FIG. 2 is a circuit diagram of an operational amplifier 10-2 according to another exemplary embodiment of the present invention. Referring to FIG. 2, the operational amplifier 10-2 includes the differential amplifier 11, the output stage 23, and the control unit. Since the structure of the differential amplifier 11 of FIG. 2 is the same as that of the differential amplifier 11 of FIG. 1 and the structure of the output stage 23 of FIG. 2 is substantially the same as that of the output stage 23 of FIG. 1, detailed descriptions thereof are not needed.

A current source N3 of the differential amplifier 11 that may be embodied by an NMOSFET, which is controlled in response to an externally input bias control voltage. The control unit includes a first self biased cascode current mirror 13', a second self biased cascode current mirror 15', a third self biased cascode current mirror 17a, a first current control circuit 25, a second current control circuit 27, and a bias circuit 21.

The control unit controls the voltage of the first control node ND3 and the voltage of the second control node ND4 in response to the voltage of the first intermediate node IND1 and the voltage of the first intermediate node IND1. Accordingly, the output stage 23 can perform a class AB amplification operation in response to the voltage of the first control node ND3 and the voltage of the second control node ND4.

The first self biased cascode current mirror 13' includes a plurality of transistors P1, P2, and P3 serially connected between the first power VDD and the first output node ND1, a plurality of transistors P13 and P14 serially connected between the first power VDD and the first control node ND3, a plurality of transistors P4 and P5 serially connected between the first power VDD and the second intermediate node IND2, and a plurality of transistors P11 and P12 serially connected between the first power VDD and the third intermediate node IND3.

For example, the first self biased cascode current mirror 13' mirrors a first current flowing into a branch connected to the first output node ND1 to each of a mirror current branch connected to the first control node ND3, a mirror current branch connected to the second intermediate node IND2, and a mirror current branch connected to the third intermediate node IND3. The first self biased cascode current mirror 13' includes a diode connected transistor P3 for self bias.

The transistors indicated by "PX" denote PMOSFETs and the transistors indicated by "NX" denote NMOSFETs. The gates of the transistors P2, P3, P5, P12, P14, and CT1 are connected to the first output node ND1. Further, the gates of the transistors P1, P4, P11, and P13 are connected to the source of the transistor P3.

The second self biased cascode current mirror 15' includes a plurality of transistors P6, P7, and P8 serially connected between the first power VDD and the second output node ND2, a plurality of transistors P9 and P10 serially connected between the first power VDD and the first intermediate node IND1, and a plurality of transistors P15 and P16 serially connected between the first power VDD and a fourth intermediate node IND4.

For example, the second self biased cascode current mirror 15' mirrors a second current flowing into a branch connected to the second output node ND2 to each of a mirror current branch connected to the first intermediate node IND1 and a mirror current branch connected to the fourth intermediate node IND4. The second self biased cascode current mirror 15' includes a diode connected transistor P8 for self bias. The gates of the transistors P7, P8, P10, and P16 are connected to the second output node ND2. Also, the gates of the transistors P6, P9, and P15 are connected to the source of the transistor P8.

The third self biased cascode current mirror 17a includes a plurality of transistors N6, N7, and N8 serially connected between the first intermediate node IND1 and the second power VSS and a plurality of transistors N9 and N10 serially connected between the second control node ND4 and the second power VSS.

For example, the third self biased cascode current mirror 17a mirrors current flowing into a branch connected to the first intermediate node IND1 to a mirror current branch connected to the second control node ND4. The third self biased cascode current mirror 17a includes a diode connected transistor N8 for self bias. The gates of the transistors N7, N8, N10, and CT2 are connected to the first intermediate node IND1. Further, the gates of the transistors N6 and N9 are connected to the source of the transistor N8.

The first current control circuit 25 includes a plurality of transistors N11, N12, and N13 serially connected between the second intermediate node IND2 and the second power VSS and a plurality of transistors N14 and N15 serially connected between the third intermediate node IND3 and the second power VSS. The first current control circuit 25 includes a diode connected transistor N13 for self bias. The gates of the transistors N12 and N13 are connected to the second intermediate node IND2. Also, the gates of the transistors N11 and N14 are connected to the source of the transistor N13. The second input signal Vin− is input to the gate of the transistor N15.

The first current control circuit 25 has a structure of a current mirror capable of mirroring the current that is mirrored by the first self biased cascode current mirror 13'. For example, the first current control circuit 25 may generate a first variable current including at least part of the bias current of the differential amplifier 11, that is, the current flowing in the bias transistor N3, based on the second input signal Vin− and the first current mirrored by the first self biased cascode current mirror 13'. For example, when the size of the transistor N11 is A times greater than that of the transistor N14, the first variable current is proportional to the first current at a rate of A times.

The second current control circuit 27 includes a plurality of transistors N6, N7, and N8 serially connected between the first intermediate node IND1 and the second power source VSS and a pair of transistors N16 and N17 serially connected between the fourth intermediate node IND4 and the second power source VSS. The second current control circuit 27 includes a diode connected transistor N8 for self bias. The gates of the transistors N6 and N16 are connected to the source of the transistor N8. The first input signal Vin+ is input to the gate of the transistor N17.

The second current control circuit 27 may generate a second variable current including at least part of the bias current of the differential amplifier 11, that is, the current flowing into the bias transistor N3, based on the first input signal Vin+ and the second current mirrored by the second self biased cascode current mirror 15'. When the size of the transistor N6 is A times greater than that of the transistor N16, the second variable current is proportional to the second current at a rate of A times.

The bias current of the differential amplifier 11 may be a sum of the static current of the transistor N3, the first variable current, and the second variable current. The first variable current and the second variable current may vary differentially or complementarily according to the voltage difference between the differential input signal pair Vin+ and Vin−.

Since the operational amplifier 10-2 adaptively varies the bias current of the differential amplifier 11 using each of the first and second current control circuits 25 and 27, power consumption is reduced by decreasing the static current and slew rate is improved by increasing dynamic current.

Figure 3:
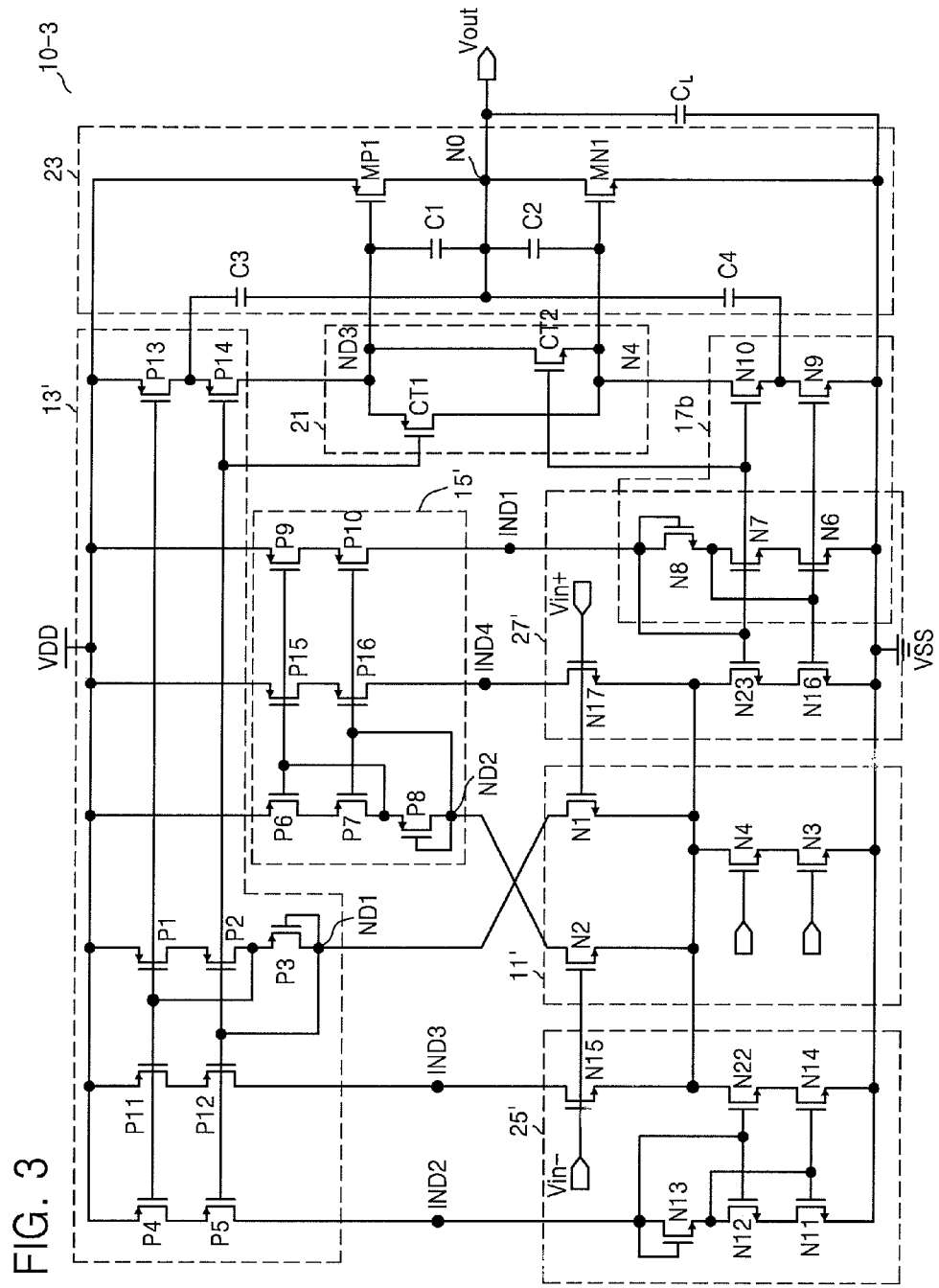
FIG. 3 is a circuit diagram of an operational amplifier according to still another exemplary embodiment of the present invention.

FIG. 3 is a circuit diagram of an operational amplifier 10-3 according to still another exemplary embodiment of the present invention. Referring to FIG. 3, the operational amplifier 10-3 includes a differential amplifier 11', the output stage 23, and the control unit. The differential amplifier 11' includes a pair of transistors N1 and N2 connected to the second power source VSS via two bias transistors N3 and N4 that are serially connected to each other. The differential amplifier 11' amplifies the voltage difference between the input signals Vin+ and Vin− and outputs a first output current via the first output node ND1 and a second output current via the second output node ND2 according to a result of the amplification.

The third self biased cascode current mirror 17b includes a plurality of transistors N6, N7, and N8 serially connected between the first intermediate node IND1 and the second power VSS. The gate and drain of a diode connected transistor N8 for self bias are connected to the first intermediate node IND1. The gates of the transistors N7, N8, N10, N23, and CT2 are connected to the first intermediate node IND1. The gates of the transistors N6, N9, and N16 are connected to the source of the transistor N8. The third self biased cascode current mirror 17b can mirror the second current that is mirrored by the second self biased cascode current mirror 15'.

The first current control circuit 25' includes a plurality of transistors N11, N12, and N13 serially connected between the second intermediate node IND2 and the second power source VSS and a plurality of transistors N14, N15, and N22 serially connected between the third intermediate node IND3 and the second power source VSS. The transistors N11, N12, N13, N14, and N22 form a self biased cascode current mirror. The transistor N13 is used as a diode connected transistor for self bias. The gates of the transistors N12, N13, and N22 are connected to the second intermediate node IND2. The gates of the transistors N11 and N14 are connected to the source of the transistor N13. The second input signal Vin− is input to the gate of the transistor N15.

For example, the first current control circuit 25' may generate a first variable current including at least part of the bias current of the differential amplifier 11', that is, the current flowing into the bias transistors N3 and N4, based on the second input signal Vin− and the first current mirrored by the first self biased cascode current mirror 13'.

The second current control circuit 27' includes the transistors N6, N7, and N8 serially connected between the first intermediate node IND1 and the second power source VSS and a plurality of transistors N16, N17, and N23 serially connected between the fourth intermediate node IND4 and the second power source VSS. The transistors N6, N7, N16, and N23 form a self biased cascode current mirror.

The second current control circuit 27' may generate a second variable current including at least part of the bias current of the differential amplifier 11', that is, the current flowing in the bias transistors N3 and N4, based on the first input signal Vin+ and the second current mirrored by the second self biased cascode current mirror 15'. The sources of the transistors N1, N2, N15, and N17 are connected to the second power source VSS. When only the sources of the transistors N1 and N2 are connected to the second power source VSS, the bias current of the differential amplifier 11' varies according to a differential signal between the first and second signals Vin+ and Vin−.

For example, when the voltage of the first input signal Vin+ and the voltage of the second input signal Vin− are different from each other, in the operational amplifiers 10-2 or 10-3, since the gate-source voltages of the transistors N1 and N2 are increased by the first current control circuit 25 or 25' and the second current control circuit 27 or 27' in proportion to the voltage difference between the first and second signals Vin+ and Vin−, the bias current of each of the differential amplifiers 10-2 or 10-3 are increased. When the voltage of the first input signal Vin+ and the voltage of the second input signal Vin− are the same, the operational amplifier 10-2 or 10-3 have the same characteristics as those of the operational amplifier 10-1.

Figure 4:
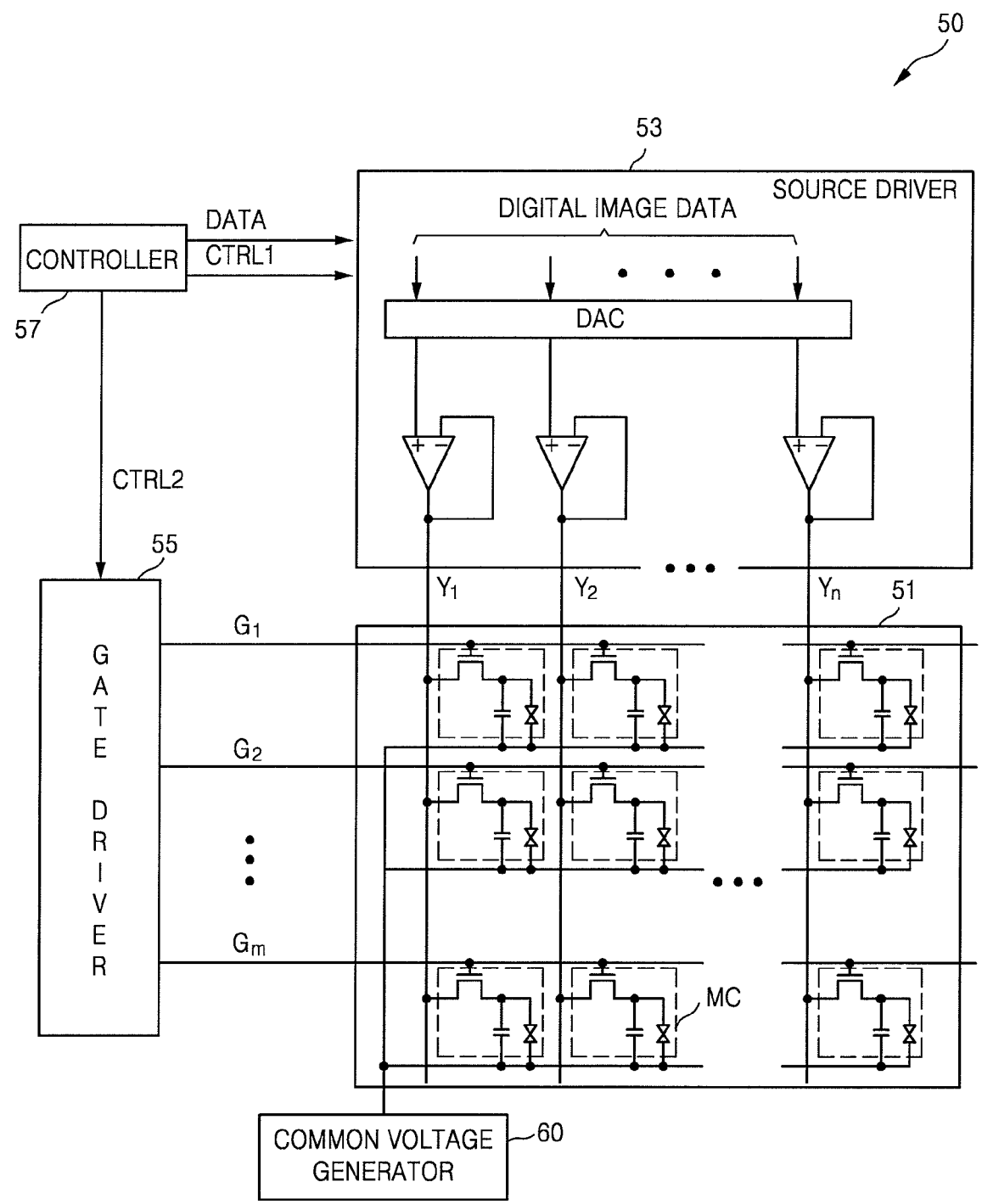
FIG. 4 is a block diagram of a display device including an operational amplifier according to an exemplary embodiment of the present invention.

FIG. 4 is a block diagram of a display device 50 according to an exemplary embodiment of the present invention. The display device may include any of the operational amplifiers 10-1, 10-2, and 10-3 described above. Referring to FIG. 4, the display device 50 includes a liquid crystal panel 51, a source driver 53, a gate driver 55, a controller 57, and a common voltage generator 60.

The liquid crystal panel 51 includes a plurality of data lines (or source lines) Y1, Y2, . . . , Yn, where "n" is a natural number, a plurality of gate lines G1, G2, . . . , Gm, where "m" is a natural number, and a plurality of pixels.

The controller 57 generates a plurality of control signals CTRL1 and CTRL2 for controlling the operation of the display device 50, outputs the control signal CTRL1 and digital image data DATA to the source driver 53, and outputs the control signal CTRL2 to the gate driver 55.

The source driver 53 receives the digital image data DATA and the control signal CTRL1 output from the controller 57 and outputs an analog voltage corresponding to the digital image data DATA to a plurality of data lines Y1, Y2, . . . , Yn connected to the display panel 51 in response to the control signal CTRL1.

The gate driver 55 sequentially drives the gate lines G1, G2, . . . , Gm in response to the control signal CTRL2. The common voltage generator 60 generates a voltage for charging/discharging a common electrode line corresponding to the plurality of source lines Y1, Y2, . . . , Yn.

Figure 5A:
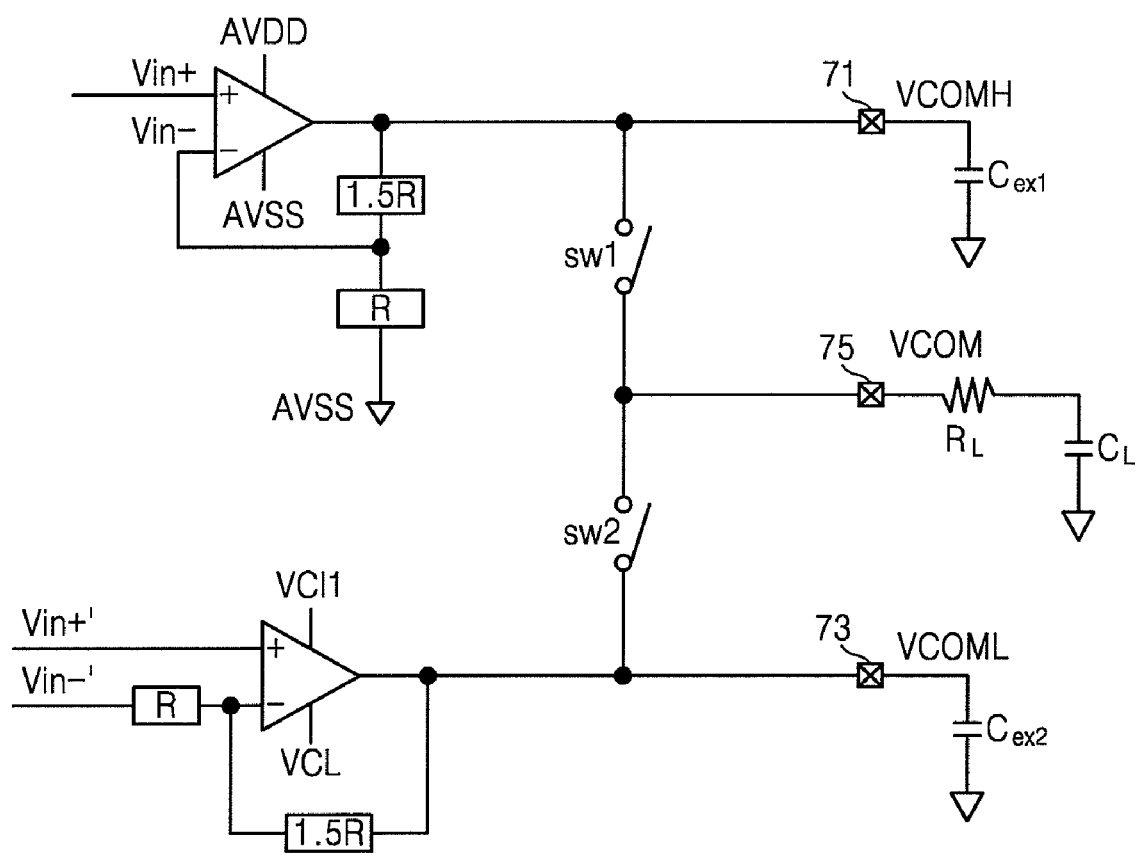
FIG. 5A is a circuit diagram of a common voltage generator including a conventional operational amplifier.
Figure 5B:
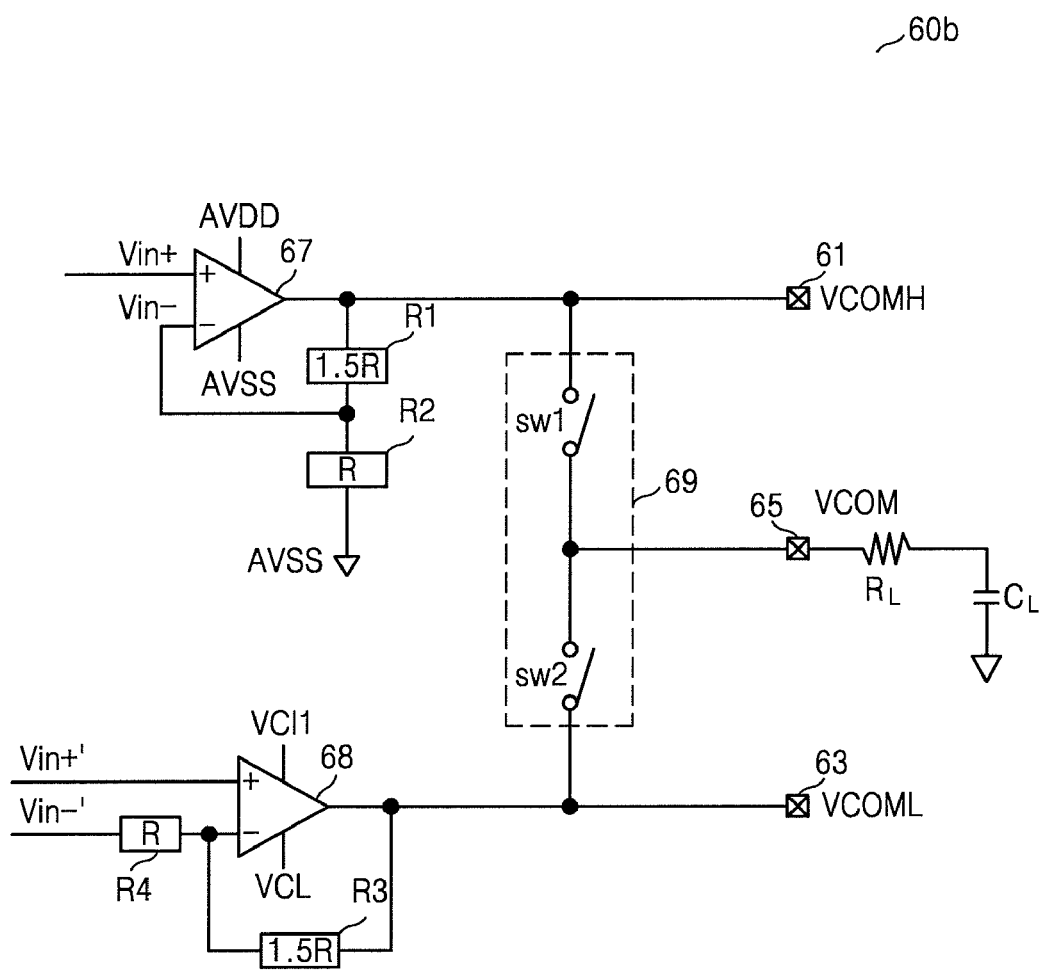
FIG. 5B is a circuit diagram of a common voltage generator including an operational amplifier according to an exemplary embodiment of the present invention.

FIG. 5A is a circuit diagram of a common voltage generator 60a including a conventional operational amplifier. FIG. 5B is a circuit diagram of a common voltage generator 60b including the operational amplifier 10-X (where X is 1, 2, or 3) according to an exemplary embodiment of the present invention. The common voltage generator 60b includes a first pad 61, a second pad 63, a common pad 65, a first operational amplifier 67, a second operational amplifier 68, and a switching portion 69.

Each of the first and second operational amplifiers 67 and 68 may be embodied by the operational amplifier 10-X, where X=1, 2, or 3, according to the embodiments shown in FIG. 1, 2, or 3. A resistor R1 or R3 may be connected between an output terminal of each of the first and second operational amplifiers 67 and 68 and a second input terminal.

The load capacitance of the common electrode line may be modeled as a parasitic resistance RL and a parasitic capacitance CL. Accordingly, the load of the common electrode line connected to the common pad 65 may be modeled as the parasitic resistance RL and the parasitic capacitance CL.

The switching portion 69 may output an output signal of the first operational amplifier 67 to the first pad 61 and the common pad 65 in response to a switching signal. Accordingly, the voltage VCOMH of the first pad 61 and the voltage VCOM of the common pad 65 are the same. The switching portion 69 may output an output signal of the second operational amplifier 68 to the second pad 63 and the common pad 65 in response to the switching signal. Thus, the voltage VCOML of the second pad 63 and the voltage VCOM of the common pad 65 are the same.

For example, the first operational amplifier 67 may output a first common voltage VCOMH that swings between a first voltage AVDD and a second voltage AVSS in response to the first input signal Vin+ input through a first input (+) terminal and the second input signal Vin− fedback through a second input (−) terminal, which is a signal divided by the resistors R1 and R2. The second operational amplifier 68 may output a second common voltage VCOML that swings between a third voltage VC11 and a fourth voltage VCL in response to a third input signal Vin+' input through a third input (+) terminal and a fourth input signal Vin−' determined by the resistors R3 and R4 and input through a fourth input (−) terminal. For example, the switching portion 69 switches a first switch SW1 or a second switch SW2 in response to the switch signal so as to output the first common voltage VCOMH or the second common voltage VCOML to each of the pixels.

In the conventional common voltage generator 60a of FIG. 5A, the voltage level of a first common voltage VCOMH output from a first operation amplifier and the voltage level of a second common voltage VCOML output from a second operation amplifier become unstable due to a load capacitance connected to a common pad 75. Accordingly, in the common voltage generator 60a, external capacitors Cex1 and Cex2 are respectively connected between a ground and a first pad 71 for outputting the first common voltage VCOMH and between a ground and/or a second pad 73 for outputting the second common voltage VCOML.

The external capacitors Cex1 and Cex2 minimize the effect of noise by the load capacitance of the common electrode line connected to the common pad 75 so that the voltage levels of the first and second common voltages VCOMH and VCOML are stabilized. The capacitance values of the external capacitors Cex1 and Cex2 need to be increased as the load capacitance of the common electrode line connected to the common pad 75 increases, thereby increasing the physical sizes of the external capacitors Cex1 and Cex2. Thus, the layout size of the common voltage generator 60a increases.

However, in the common voltage generator 60b including an operational amplifier 10-X according an exemplary embodiment of the present invention, the first and second common voltages VCOMH and VCOML can be stably output by minimizing the effect of noise without the external capacitors Cex1 and Cex2. Thus, in a common voltage generator 60b according to an exemplary embodiment of the present invention, by removing the external capacitors Cex1 and Cex2, a wide bandwidth can be secured and the layout size of the common voltage generator 60b can be reduced.

Figure 6:
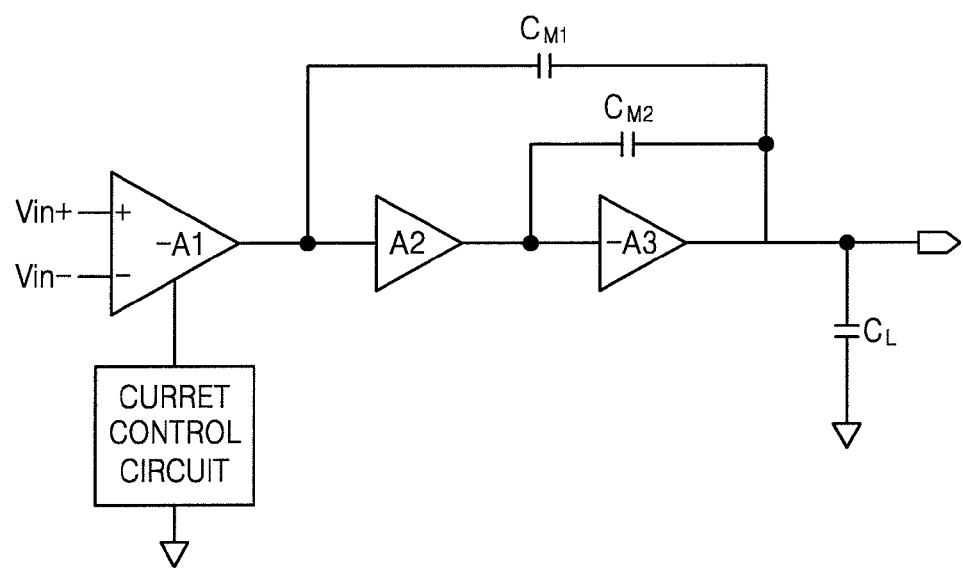
FIG. 6 is a circuit diagram of a small signal model of an operational amplifier according to an exemplary embodiment of the present invention.

FIG. 6 is a circuit diagram of a small signal model of an operational amplifier 10-X, where X=1, 2, or 3, according to an exemplary embodiment of the present invention. The operational amplifier 10-X may be configured to consume less power by suitable adjustment of the gains A1, A2 and A3 of the different stages of the small signal model. For example, the gains A2 and A3 of the second and third stages of the signal model are increased and the gain A1 of the first stage is decreased by nested cascode Miller compensation of a multistage operational amplifier 10-x (e.g., 3-stage), and a small amount of static current is supplied in a static state by using a current control circuit, for example, the current control circuits 25 and 27 of FIG. 2 or the current control circuits 25' and 27' of FIG. 3, so that the capacitance of a compensation capacitor CM1 can be reduced.

The bandwidth of the operational amplifier 10-X increases as the capacitance of the compensation capacitor CM1 decreases. Within a predetermined range, for example, 0-30 nF, the operational amplifier 10-X can remove noise from an output terminal and output a stable output voltage regardless of the change in load of a common electrode line. Accordingly, an operational amplifier according to at least one exemplary embodiment of the present invention can increase the stability of the operational amplifier using a small compensation capacitance and decrease the layout size. Further, by varying the bias current of an input stage using the current control circuit, the operational amplifier decreases static current to reduce power consumption, and increases dynamic current to improve a slew rate.

Furthermore, by applying the voltage of each output node of the differential amplifier 11 as the bias voltage of the bias circuit 21, the number of the bias voltages of the operational amplifier is decreased so that the layout size can be reduced. Accordingly, in an operational amplifier according to at least exemplary embodiment of the present invention, the structure of the corresponding bias circuit can be simplified.

In at least one exemplary embodiment of the present invention, the operational amplifier simultaneously has a high slew rate and a reduced layout size. Further, the operation amplifier can stably output an output voltage regardless of the change in load capacitance.

While this invention has been particularly shown and described with reference to exemplary embodiments thereof, it will be understood by those skilled in the art that various changes in form and details may be made therein without departing from the spirit and scope of the invention.

What is claimed is:

1. An operational amplifier comprising:
   a differential amplifier generating a first current through a first output node and a second current through a second output node in response to a voltage difference between a first input signal input through a first input terminal and a second input signal input through a second input terminal;
   an output stage generating an output signal through an output node; and
   a control unit receiving a voltage of the first output node and a voltage of the second output node, as bias voltages, and controlling an output current of the output stage to determine the output signal of the output stage in response to the received voltages of the first and second output nodes,
   wherein the control unit comprises:
   a first self biased cascode current mirror connected between the first output node, a first control node, and a first power source;
   a second self biased cascode current mirror connected between the second output node, the first power source, and an intermediate node;
   a third self biased cascode current mirror connected between the intermediate node, a second power source, and a second control node; and
   a bias circuit connected between the first control node and the second control node and controlling each of a voltage of the first control node and a voltage of the second control node based on the voltage of the first output node and a voltage of the intermediate node.

2. The operational amplifier of claim 1, wherein the control unit comprises:
   a first current control circuit controlling first variable current including at least part of a bias current of the differential amplifier based on the first input signal and current mirrored by the first self biased cascode current mirror; and a second current control circuit controlling second variable current including at least part of a bias current of the differential amplifier based on the second input signal and current mirrored by the third self biased cascode current mirror.

3. The operational amplifier of claim 1, wherein the bias circuit comprises:
a first transistor connected between the first control node and the second control node, wherein the first transistor is turned on and off in response to the voltage of the first output node; and
a second transistor connected between the first control node and the second control node, wherein the second transistor is turned on and off in response to the voltage of the intermediate node.

4. The operational amplifier of claim 1, wherein the output stage comprises:
a p-channel metal oxide semiconductor field effect transistor (PMOSFET) connected between the first power source and the output node, wherein the PMOSFET is turned on and off in response to the voltage of the first control node; and
an n-channel metal oxide semiconductor field effect transistor (NMOSFET) connected between the output node and the second power source, wherein the NMOSFET is turned on and off in response to the voltage of the second control node.

5. The operational amplifier of claim 1, wherein the output stage comprises:
a first compensation capacitor connected between the first control node and the output node;
a second compensation capacitor connected between the output node and the second control node;
a third compensation capacitor connected between the output node and a mirror current branch of the first self biased cascode current mirror; and
a fourth compensation capacitor connected between the output node and a mirror current branch of the third self biased cascode current mirror.

6. The operational amplifier of claim 1, further comprising a resistor connected between the output node and the second input terminal.

7. The operational amplifier of claim 1, wherein the first self biased-cascode current mirror includes a first plurality of transistors serially connected between the first power source and the first output node and a second plurality of transistors serially connected between the first power source and the first control node.

8. The operational amplifier of claim 7, wherein a drain and a gate of a first transistor of the first plurality of transistors are connected to the first output node.

9. The operational amplifier of claim 8, wherein a gate of a second transistor of the first plurality of transistors and a gate of a third transistor of the second plurality of transistors are connected to a source of the first transistor.

10. An operational amplifier comprising:
a differential amplifier generating a first current through a first output node and a second current through a second output node in response to a voltage difference between a first input signal input through a first input terminal and a second input signal input through a second input terminal;
an output stage generating an output signal through an output node; and
a control unit receiving a voltage of the first output node and a voltage of the second output node, as bias voltages, and controlling an output current of the output stage to determine the output signal of the output stage in response to the received voltages of the first and second output nodes,
wherein the control unit comprises:
a first self biased cascode current mirror connected between the first output node, a first control node, a first power source, and a first intermediate node;
a second self biased cascode current mirror connected between the second output node, the first self biased cascode current mirror, and a second intermediate node;
a third self biased cascode current mirror connected between the second intermediate node, a second power source, and a second control node; and
a bias circuit connected between the first control node and the second control node and controlling each of a voltage of the first control node and a voltage of the second control node based on the voltage of the first output node and a voltage of the second intermediate node.

11. The operational amplifier of claim 10, wherein the control unit further comprises:
a first current control circuit connected between the second power source and the first intermediate node; and
a second current control circuit connected between the second power source and the second intermediate node.

12. The operational amplifier of claim 11, wherein the first current control circuit comprises a first plurality of transistors serially connected between the first intermediate node and the second power source and a second plurality of transistors serially connected between a third intermediate and the second power source.

13. The operational amplifier of claim 11, wherein the second current control circuit comprises a first plurality of transistors serially connected between the second intermediate node and the second power source and a second plurality of transistors serially connected between a fourth intermediate node and the second power source.

14. A method of operating an operational amplifier, the method comprising:
generating first current through a first output node and second current through a second output node in response to a voltage difference between a first input signal input through a first input terminal and a second input signal input through a second input terminal, using a differential amplifier;
receiving a voltage of the first output node and a voltage of the second output node, as bias voltages, and controlling a first control voltage and a second control voltage in response to the received voltages of the first and second output nodes, using a control unit; and
controlling an output signal of an output node of an output stage in response to the first control voltage and the second control voltage,
wherein the controlling of the first control voltage and the second control voltage comprises:
mirroring the second current by using at least one self biased cascode current mirror; and
controlling the first control voltage in response to the voltage of the first output node and the second control voltage in response to the second current that is mirrored, using the control unit.

15. A display device comprising:
a liquid crystal panel including a plurality of data and gate lines;
a controller to generate a plurality of control signals to control an operation of the display device;

a source driver configured to output data signals to the data lines based on received image data and in response to at least one of the control signals;

a gate driver configured to drive the gate lines in response to at least one of the control signals and;

a common voltage generator configured to generate a voltage for charging and discharging a common electrode line corresponding to the source lines and comprising a pair of operational amplifiers, wherein each operational amplifier comprises:

a differential amplifier generating a first current through a first output node and a second current through a second output node in response to a voltage difference between a first input signal input through a first input terminal and a second input signal input through a second input terminal;

an output stage generating an output signal through an output node; and a control unit receiving a voltage of the first output node and a voltage of the second output node, as bias voltages, and controlling output current of the output stage to determine the output signal of the output stage in response to the received voltages of the first and second output nodes.

16. The display device of claim 15, wherein each operational amplifier is configured to output a first common voltage that swings between a first supply voltage and a second supply voltage in response to a first input signal input through a first input terminal and a second input signal complimentary to the first input signal and fedback through a second input terminal.

* * * * *